US010367492B2

(12) United States Patent
Jang et al.

(10) Patent No.: US 10,367,492 B2
(45) Date of Patent: Jul. 30, 2019

(54) INTERNAL CLOCK GENERATION CIRCUITS

(71) Applicant: SK hynix Inc., Icheon-si, Gyeonggi-do (KR)

(72) Inventors: Sungchun Jang, Icheon-si (KR); Kyung Whan Kim, Seoul (KR); Dong Kyun Kim, Cheongju-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 15/656,232

(22) Filed: Jul. 21, 2017

(65) Prior Publication Data

US 2018/0226956 A1 Aug. 9, 2018

(30) Foreign Application Priority Data

Feb. 9, 2017 (KR) .......................... 10-2017-0018268

(51) Int. Cl.
*H03K 5/14* (2014.01)
*H03L 7/08* (2006.01)
*H03L 7/099* (2006.01)
*H03K 5/00* (2006.01)

(52) U.S. Cl.
CPC .............. *H03K 5/14* (2013.01); *H03L 7/0805* (2013.01); *H03L 7/0998* (2013.01); *H03K 2005/00052* (2013.01)

(58) Field of Classification Search
CPC ........ H03K 2005/00052; H03L 7/0998; H03L 7/0805
See application file for complete search history.

(56) References Cited

U.S. PATENT DOCUMENTS

| 7,298,790 B2* | 11/2007 | Craninckx ............. H03L 7/081 375/294 |
| 7,417,510 B2* | 8/2008 | Huang ................. H03K 5/1565 327/117 |
| 8,841,948 B1 | 9/2014 | Chien et al. |
| 8,982,939 B2 | 3/2015 | Song |
| 2007/0194815 A1* | 8/2007 | Nelson ............ H03K 19/00323 327/112 |

(Continued)

FOREIGN PATENT DOCUMENTS

KR 1020120037190 A 4/2012

OTHER PUBLICATIONS

Hossain, Masum et al., "A Fast-Lock, Jitter Filtering All-Digital DLL Based Burst-Mode Memory Interface", IEEE Journal of Solid-State Circuits, vol. 49, Issue 4, Feb. 4, 2014, pp. 1048-1062.

(Continued)

*Primary Examiner* — Thomas J. Hiltunen
(74) *Attorney, Agent, or Firm* — William Park & Associates Ltd.

(57) ABSTRACT

An internal clock generation circuit includes an interpolation clock generation circuit and a locked clock generation circuit. The interpolation clock generation circuit generates an interpolation clock signal from a division clock signal in response to a switching control signal and a current control signal. The locked clock generation circuit includes an oscillator and generates a locked clock signal for generating an internal clock signal from the interpolation clock signal.

30 Claims, 12 Drawing Sheets

(56) References Cited

U.S. PATENT DOCUMENTS

| | | | | |
|---|---|---|---|---|
| 2011/0109355 A1* | 5/2011 | Sakaguchi | ............ | H03L 7/0814 327/157 |
| 2012/0306552 A1* | 12/2012 | Erdogan | ............... | H03L 7/0812 327/158 |
| 2013/0099837 A1* | 4/2013 | Kim | ....................... | H03K 5/131 327/149 |
| 2014/0055179 A1* | 2/2014 | Gong | ....................... | H03L 7/081 327/156 |
| 2014/0111257 A1* | 4/2014 | Ying | ...................... | H03K 3/013 327/117 |
| 2014/0184281 A1* | 7/2014 | Danny | .................... | H03L 7/081 327/115 |
| 2015/0015308 A1* | 1/2015 | Da Dalt | .................. | H03L 7/093 327/106 |

OTHER PUBLICATIONS

Kim, Byung-Guk et al., "A DLL With Jitter Reduction Techniques and Quadrature Phase Generation for DRAM Interfaces", IEEE Journal of Solid-State Circuits, vol. 44, Issue 5, May 2, 2009, pp. 1522-1530.

Kim, Kyu-Hyoun et al., "A 5.4mW 0.0035mm2 0.48psrms-Jitter 0.8-to-5GHz Non-PLL/DLL All-Digital Phase Generator/Rotator in 45nm SOI CMOS", IEEE International Solid-State Circuits Conference, Feb. 9, 2009.

* cited by examiner

FIG.4

| ICNT<2> | ICNT<1> | $\alpha$ |
|---|---|---|
| L | H | 0.75 |
| H | L | 0.5 |
| H | H | 0.25 |

US 10,367,492 B2

INTERNAL CLOCK GENERATION CIRCUITS

CROSS-REFERENCE TO RELATED APPLICATIONS

The present application claims priority under 35 U.S.C 119(a) to Korean Application No. 10-2017-0018268, filed on Feb. 9, 2017, which is incorporated herein by reference in its entirety.

BACKGROUND

1. Technical Field

Embodiments of the present disclosure relate to internal clock generation circuits generating internal clock signals.

2. Related Art

Semiconductor devices have been continuously developed to improve an operation speed as integration density of the semiconductor device increases. Synchronous semiconductor devices synchronized with an external clock signal for operation have been proposed to improve an operation speed. In the case of the synchronous semiconductor devices, if data is outputted in synchronization with the external clock signal, a delay time corresponding to an output data access time from clock (tAC) may occur to reduce a valid data window. As a result, when a synchronous semiconductor device operates at a high frequency, the synchronous semiconductor device may malfunction.

SUMMARY

According to an embodiment, an internal clock generation circuit includes an interpolation clock generation circuit and a locked clock generation circuit. The interpolation clock generation circuit generates an interpolation clock signal from a division clock signal in response to a switching control signal and a current control signal. The locked clock generation circuit includes an oscillator and generates a locked clock signal for generating an internal clock signal from the interpolation clock signal. A logic level combination of the switching control signal and a logic level combination of the current control signal are set by comparing a phase of the division clock signal with a phase of a feedback clock signal. The feedback clock signal is generated by delaying the locked clock signal for a predetermined delay time.

According to another embodiment, an internal clock generation circuit includes an interpolation clock generation circuit and a locked clock generation circuit. The interpolation clock generation circuit includes first to fourth selection drivers and selects two drivers among the first to fourth selection drivers as a first selected selection driver and a second selected selection driver in response to a switching control signal. In addition, the interpolation clock generation circuit receives a division clock signal to drive an interpolation clock signal using the first selected selection driver with a first drivability and receives the division clock signal to drive the interpolation clock signal using the second selected selection driver with a second drivability. The locked clock generation circuit includes an oscillator to generate a locked clock signal for generating an internal clock signal from the interpolation clock signal.

BRIEF DESCRIPTION OF THE DRAWINGS

Various embodiments of the present disclosure will become more apparent in view of the attached drawings and accompanying detailed description, in which:

FIG. 4 is a table illustrating an operation of the interpolation clock generation circuit shown in FIG. 3;

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
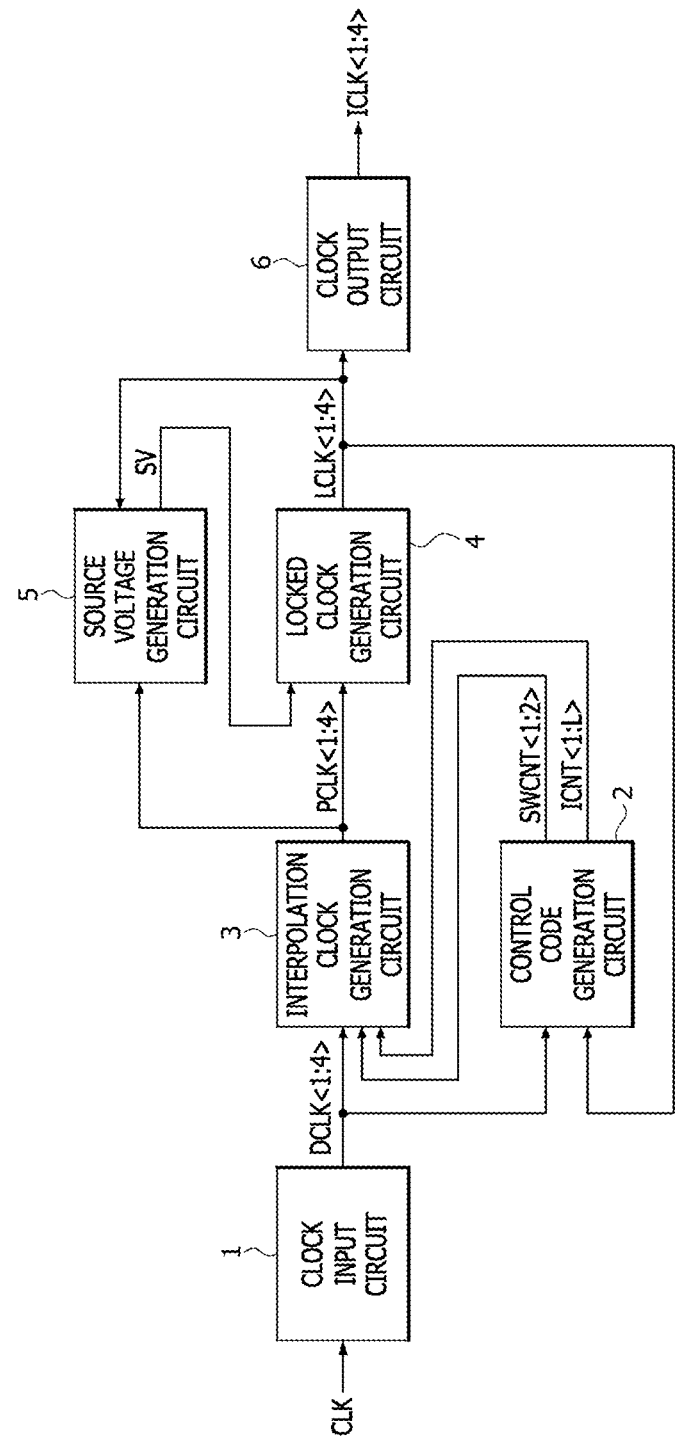
FIG. 1 is a block diagram illustrating a configuration of an internal clock generation circuit according to an embodiment of the present disclosure.

As illustrated in FIG. 1, an internal clock generation circuit according to an embodiment may include a clock input circuit 1, a control code generation circuit 2, an interpolation clock generation circuit 3, a locked clock generation circuit 4, a source voltage generation circuit 5, and a clock output circuit 6.

The clock input circuit 1 may generate a division clock signal including first to fourth division clock signals DCLK<1:4> in response to an external clock signal CLK. The clock input circuit 1 may generate the first to fourth division clock signals DCLK<1:4> having different phases from the external clock signal CLK. The first to fourth division clock signals DCLK<1:4> may be generated to have a cycle time which is twice that of the external clock signal CLK. The first division clock signal DCLK<1> may have a phase of 0° (or 360°) or 180° whenever the external clock signal CLK has a phase of 0° (or) 360°. The second division clock signal DCLK<2> may be generated so that a phase difference between the first and second division clock signals DCLK<1:2> is 90°. The third division clock signal DCLK<3> may be generated so that a phase difference between the first and third division clock signals DCLK<1> and DCLK<3> is 180°. The fourth division clock signal DCLK<4> may be generated so that a phase difference between the first and fourth division clock signals DCLK<1> and DCLK<4> is 270°. The cycle time of the first to fourth division clock signals DCLK<1:4> and the phase difference between the first to fourth division clock signals DCLK<1:4> may be set to be different according to the embodiment. The number of the division clock signals may also be set to be different according to the embodiment.

The control code generation circuit 2 may generate a switching control signal including one or more of first and second switching control signals SWCNT<1:2> and a current control signal including one or more of first to $L^{th}$ current control signals ICNT<1:L> in response to the first to fourth division clock signals DCLK<1:4> and a locked clock signal including first to fourth locked clock signals LCLK<1:4>. The control code generation circuit 2 may detect phase differences between clock signals which are generated by delaying the first to fourth division clock signals DCLK<1:4> and the first to fourth locked clock signals LCLK<1:4> to generate the first and second switching control signals SWCNT<1:2> and the first to $L^{th}$ current control signals ICNT<1:L>. The first and second switching control signals SWCNT<1:2> may have a logic level combination for generating an interpolation clock signal including first to fourth interpolation clock signals PCLK<1:4> that compensate for a delay factor of an internal circuit of a semiconductor device in relation to the external clock signal CLK. The first to $L^{th}$ current control signals ICNT<1:L> may have a logic level combination for generating the first to fourth interpolation clock signals PCLK<1:4> that compensate for a delay factor of an internal circuit of a semiconductor device in relation to the external clock signal CLK. A logic level combination of the first and second switching control signals SWCNT<1:2> and a logic level combination of the first to $L^{th}$ current control signals ICNT<1:L> may be set to be different according to the embodiment. The number of the locked clock signals may be set to be less or greater than four according to the embodiment. The number of the switching control signals may be set to be less or greater than two according to the embodiment. The number "L" of the current control signals may be set to be different according to the embodiment.

The interpolation clock generation circuit 3 may generate the first to fourth interpolation clock signals PCLK<1:4> from the first to fourth division clock signals DCLK<1:4> in response to the first and second switching control signals SWCNT<1:2> and the first to $L^{th}$ current control signals ICNT<1:L>. The interpolation clock generation circuit 3 may receive the first to fourth division clock signals DCLK<1:4> to drive the first to fourth interpolation clock signals PCLK<1:4> according to logic level combinations of the first and second switching control signals SWCNT<1:2> and the first to $L^{th}$ current control signals ICNT<1:L>. The interpolation clock generation circuit 3 may control an amount of current for driving the first to fourth division clock signals DCLK<1:4> according to a logic level combination of the first to $L^{th}$ current control signals ICNT<1:L>. An amount of current controlled according to a logic level combination of the first to $L^{th}$ current control signals ICNT<1:L> may be set to be different according to the embodiment. The interpolation clock generation circuit 3 may drive the first to fourth division clock signals DCLK<1:4> in response to at least one of the first to fourth division clock signals DCLK<1:4>, which is selected according to a logic level combination of the first and second switching control signals SWCNT<1:2>. At least one of the first to fourth division clock signals DCLK<1:4>, which is selected according to a logic level combination of the first and second switching control signals SWCNT<1:2>, may be set to be different according to the embodiment. The number of the interpolation clock signals may be set to be less or greater than four according to the embodiment.

The locked clock generation circuit 4 may generate the first to fourth locked clock signals LCLK<1:4> in response to the first to fourth interpolation clock signals PCLK<1:4>. The locked clock generation circuit 4 may be synchronized with the first to fourth interpolation clock signals PCLK<1:4> to generate the first to fourth locked clock signals LCLK<1:4>. The locked clock generation circuit 4 may include an oscillator (see FIG. 7) generating a periodic signal having a predetermined cycle time. A cycle time of the periodic signal generated by the oscillator included in the locked clock generation circuit 4 may be controlled by a voltage level of a source voltage signal SV. A difference between a cycle time of the periodic signal generated by the oscillator and a cycle time of the first to fourth interpolation clock signals PCLK<1:4> may be set to be less than a certain value.

The source voltage generation circuit 5 may generate the source voltage signal SV supplied to the locked clock generation circuit 4 in response to the first to fourth interpolation clock signals PCLK<1:4> and the first to fourth locked clock signals LCLK<1:4>. The source voltage generation circuit 5 may delay the first to fourth interpolation clock signals PCLK<1:4> by a cycle time of the periodic signal generated by the oscillator included in the locked clock generation circuit 4 and may compare phases of the delayed interpolation clock signals with phases of the first to fourth locked clock signals LCLK<1:4> to control a voltage level of the source voltage signal SV. The source voltage generation circuit 5 may control a voltage level of the source voltage signal SV until a difference between a cycle time of the periodic signal generated by the oscillator included in the locked clock generation circuit 4 and a cycle time of the first to fourth interpolation clock signals PCLK<1:4> is less than a certain value. In some embodiments, after the source voltage generation circuit 5 controls a voltage level of the source voltage signal SV and terminates its operation, the control code generation circuit 2 may control a logic level combination of the first and second switching control signals SWCNT<1:2> and a logic level combination of the first to $L^{th}$ current control signals ICNT<1:L>.

The clock output circuit 6 may generate first to fourth internal clock signals ICLK<1:4> in response to the first to fourth locked clock signals LCLK<1:4>. The clock output circuit 6 may buffer the first to fourth locked clock signals LCLK<1:4> to generate the first to fourth internal clock signals ICLK<1:4>. In some embodiments, the clock output circuit 6 may delay the first to fourth locked clock signals LCLK<1:4> for a predetermined delay time to generate the first to fourth internal clock signals ICLK<1:4>.

Figure 2:
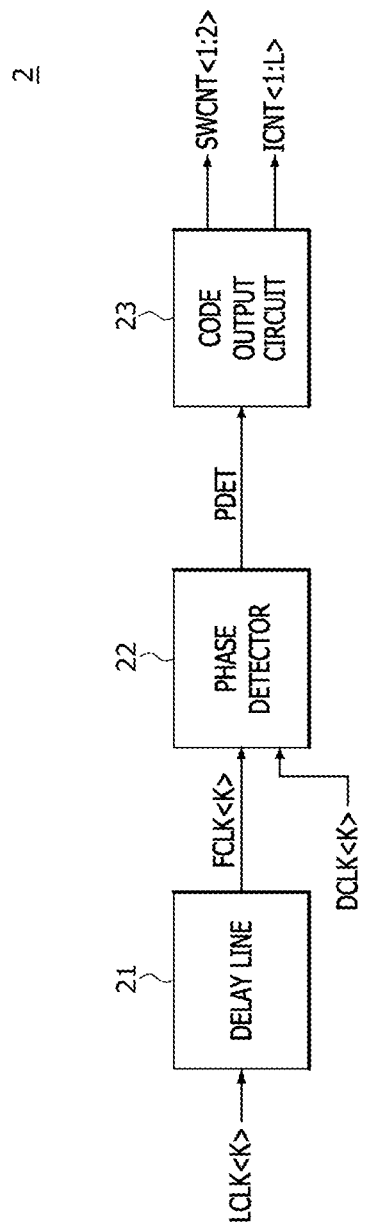
FIG. 2 is a block diagram illustrating an example of a control code generation circuit included in the internal clock generation circuit of FIG. 1.

Referring to FIG. 2, the control code generation circuit 2 may include a delay line 21, a phase detector 22, and a code output circuit 23.

The delay line 21 may generate a $K^{th}$ feedback clock signal FCLK<K> in response to a $K^{th}$ locked clock signal LCLK<K> among the first to fourth locked clock signals LCLK<1:4>. The delay line 21 may delay the $K^{th}$ locked clock signal LCLK<K> for a predetermined delay time to generate the $K^{th}$ feedback clock signal FCLK<K>. In the $K^{th}$ locked clock signal LCLK<K> and the $K^{th}$ feedback clock signal FCLK<K>, the numeral "K" may be any one of one, two, three, or four. A delay time of the delay line 21 may be set to be a time period which is capable of compensating for a delay factor of an internal circuit included in a semiconductor device in relation to the external clock signal CLK. The delay time of the delay line 21 may be set to be different according to the embodiment.

The phase detector 22 may detect a phase difference between the $K^{th}$ feedback clock signal FCLK<K> and the $K^{th}$ division clock signal DCLK<K> to generate a phase detection signal PDET. The phase detector 22 may compare a phase of the $K^{th}$ feedback clock signal FCLK<K> with a phase of the $K^{th}$ division clock signal DCLK<K> to generate the phase detection signal PDET. The phase detector 22 may generate the phase detection signal PDET having a first logic level if a phase of the $K^{th}$ feedback clock signal FCLK<K> precedes a phase of the $K^{th}$ division clock signal DCLK<K>. In contrast, the phase detector 22 may generate the phase detection signal PDET having a second logic level if a phase of the $K^{th}$ division clock signal DCLK<K> precedes a phase of the $K^{th}$ feedback clock signal FCLK<K>.

The code output circuit 23 may generate the first and second switching control signals SWCNT<1:2> and the first to $L^{th}$ current control signals ICNT<1:L> in response to the phase detection signal PDET. The code output circuit 23 may generate the first and second switching control signals SWCNT<1:2> and the first to $L^{th}$ current control signals ICNT<1:L>, logic level combinations of which vary to increase a delay time of the delay line 21 if the phase detection signal PDET has the first logic level. The code output circuit 23 may generate the first and second switching control signals SWCNT<1:2> and the first to $L^{th}$ current control signals ICNT<1:L>, logic level combinations of which vary to reduce a delay time of the delay line 21 if the phase detection signal PDET has the second logic level. The code output circuit 23 may output the first and second switching control signals SWCNT<1:2> and the first to $L^{th}$ current control signals ICNT<1:L> that are counted according to a logic level of the phase detection signal PDET.

Figure 3:
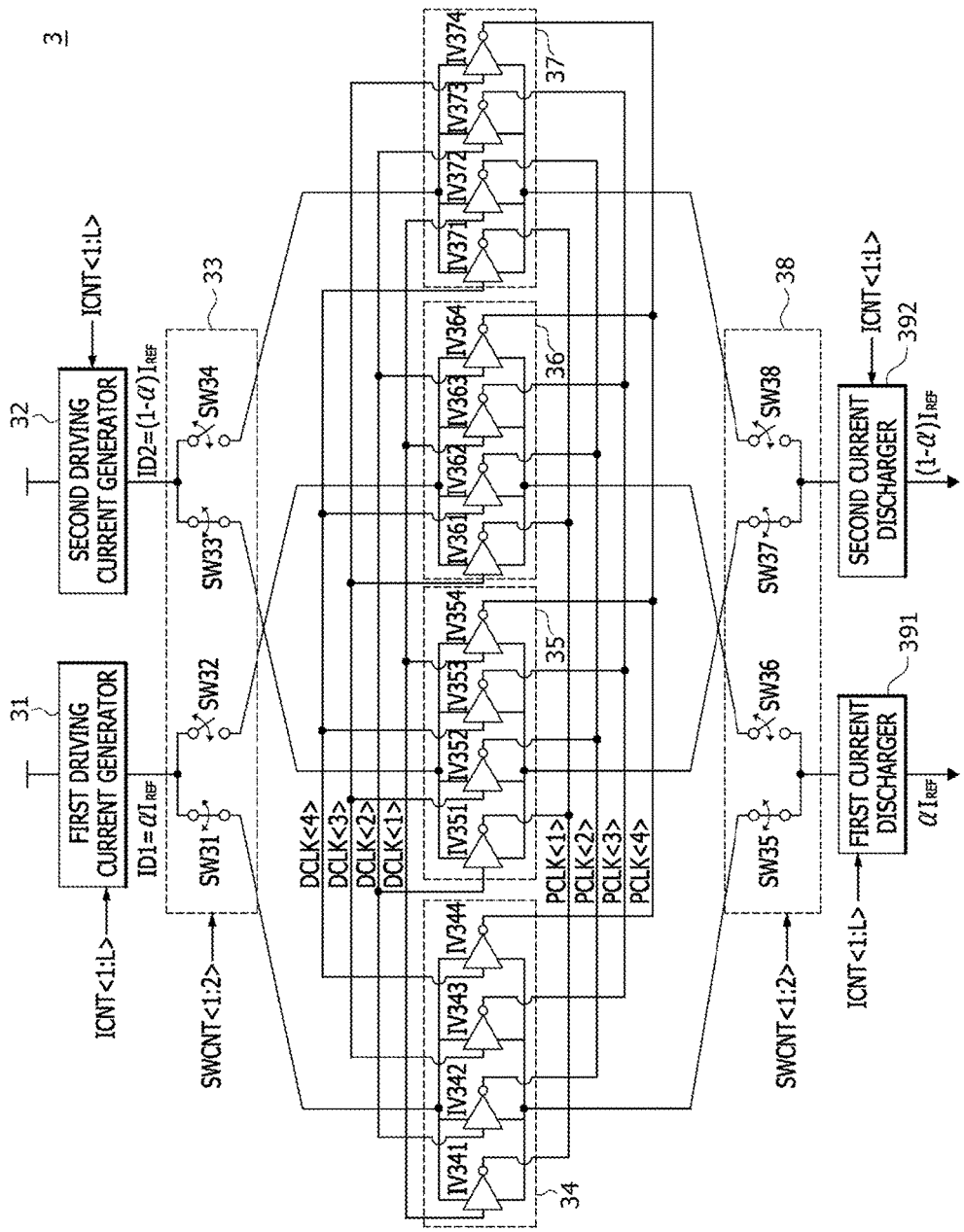
FIG. 3 is a circuit diagram illustrating an example of an interpolation clock generation circuit included in the internal clock generation circuit of FIG. 1.

Referring to FIG. 3, the interpolation clock generation circuit 3 may include a first driving current generator 31, a second driving current generator 32, a driving current selection/supply unit 33, a first selection driver 34, a second selection driver 35, a third selection driver 36, a fourth selection driver 37, a driving current selection/discharge unit 38, a first current discharger 391, and a second current discharger 392.

The first driving current generator 31 may generate a first driving current ID1 in response to the first to $L^{th}$ current control signals ICNT<1:L>. The first driving current generator 31 may control an amount $\alpha I_{REF}$ of the first driving current ID1 according to a logic level combination of the first to $L^{th}$ current control signals ICNT<1:L>. The amount $\alpha I_{REF}$ of the first driving current ID1 controlled according to a logic level combination of the first to $L^{th}$ current control signals ICNT<1:L> will be described in detail with reference to FIG. 4 later.

The second driving current generator 32 may generate a second driving current ID2 in response to the first to $L^{th}$ current control signals ICNT<1:L>. The second driving current generator 32 may control an amount $(1-\alpha)I_{REF}$ of the second driving current ID2 according to a logic level combination of the first to $L^{th}$ current control signals ICNT<1:L>. The amount $(1-\alpha)I_{REF}$ of the second driving current ID2 controlled according to a logic level combination of the first to $L^{th}$ current control signals ICNT<1:L> will be described in detail with reference to FIG. 4 later.

The driving current selection/supply unit 33 may supply the first and second driving currents ID1 and ID2 to the first to fourth selection drivers 34, 35, 36, and 37 in response to the first and second switching control signals SWCNT<1:2>. The driving current selection/supply unit 33 may selectively supply the first and second driving currents ID1 and ID2 to the first to fourth selection drivers 34, 35, 36, and 37 according to a logic level combination of the first and second switching control signals SWCNT<1:2>.

The driving current selection/supply unit 33 may include a first switch SW31 and a third switch SW33 which are turned on and a second switch SW32 and a fourth switch SW34 which are turned off, if the first and second switching control signals SWCNT<1:2> have a logic level combination of 'L,L'. The turned on switches among the first to fourth switches SW31, SW32, SW33, and SW34 according to a logic level combination of the first and second switching control signals SWCNT<1:2> may be set to be different according to the embodiment. In the first and second switching control signals SWCNT<1:2>, a logic level combination of 'L,L' means that both of the first and second switching control signals SWCNT<1:2> have a logic "low" level. If the first and second switching control signals SWCNT<1:2> have a logic level combination of 'L,L', the driving current selection/supply unit 33 may supply the first driving current ID1 to the first selection driver 34 through the first switch SW31 which is turned on and may supply the second driving current ID2 to the second selection driver 35 through the third switch SW33 which is turned on.

If the first and second switching control signals SWCNT<1:2> have a logic level combination of 'L,H', the first and fourth switches SW31 and SW34 of the driving current selection/supply unit 33 may be turned on and the second and third switches SW32 and SW33 of the driving current selection/supply unit 33 may be turned off. In the first and second switching control signals SWCNT<1:2>, a logic level combination of 'L,H' means that the first switching control signal SWCNT<1> has a logic "low" level and the second switching control signal SWCNT<2> has a logic "high" level. If the first and second switching control signals SWCNT<1:2> have a logic level combination of 'L,H', the driving current selection/supply unit 33 may supply the first driving current ID1 to the first selection driver 34 through the first switch SW31 which is turned on and may supply the second driving current ID2 to the fourth selection driver 37 through the fourth switch SW34 which is turned on.

If the first and second switching control signals SWCNT<1:2> have a logic level combination of 'H,L', the second and third switches SW32 and SW33 of the driving current selection/supply unit 33 may be turned on and the first and fourth switches SW31 and SW34 of the driving current selection/supply unit 33 may be turned off. In the first and second switching control signals SWCNT<1:2>, a logic level combination of 'H,L' means that the first switching control signal SWCNT<1> has a logic "high" level and the second switching control signal SWCNT<2> has a logic "low" level. If the first and second switching control signals SWCNT<1:2> have a logic level combination of 'H,L', the driving current selection/supply unit 33 may supply the first driving current ID1 to the third selection driver 36 through the second switch SW32 which is turned on and may supply the second driving current ID2 to the second selection driver 35 through the third switch SW33 which is turned on.

If the first and second switching control signals SWCNT<1:2> have a logic level combination of 'H,H', the second and fourth switches SW32 and SW34 of the driving current selection/supply unit 33 may be turned on and the first and third switches SW31 and SW33 of the driving current selection/supply unit 33 may be turned off. In the first and second switching control signals SWCNT<1:2>, a logic level combination of 'H,H' means that the first switching control signal SWCNT<1> has a logic "high" level and the second switching control signal SWCNT<2> has a logic "high" level. If the first and second switching control signals SWCNT<1:2> have a logic level combination of 'H,H', the driving current selection/supply unit 33 may supply the first driving current ID1 to the third selection driver 36 through the second switch SW32 which is turned on and may supply the second driving current ID2 to the fourth selection driver 37 through the fourth switch SW34 which is turned on.

The first selection driver 34 may receive the first to fourth division clock signals DCLK<1:4> to drive the first to fourth interpolation clock signals PCLK<1:4> using the first driving current ID1 as a power supply current. The first selection driver 34 may receive the first driving current ID1 through the first switch SW31 which is turned on by the first switching control signal SWCNT<1> having a logic "low" level. The first selection driver 34 may include a first inverter IV341 driving the first interpolation clock signal PCLK<1> in response to the first division clock signal DCLK<1>, a second inverter IV342 driving the second interpolation clock signal PCLK<2> in response to the second division clock signal DCLK<2>, a third inverter IV343 driving the third interpolation clock signal PCLK<3> in response to the third division clock signal DCLK<3>, and a fourth inverter IV344 driving the fourth interpolation clock signal PCLK<4> in response to the fourth division clock signal DCLK<4>.

The second selection driver 35 may receive the first to fourth division clock signals DCLK<1:4> to drive the first to fourth interpolation clock signals PCLK<1:4> using the second driving current ID2 as a power supply current. The second selection driver 35 may receive the first driving current ID1 through the third switch SW33 which is turned on by the second switching control signal SWCNT<2> having a logic "low" level. The second selection driver 35 may include a first inverter IV351 driving the first interpolation clock signal PCLK<1> in response to the second division clock signal DCLK<2>, a second inverter IV352 driving the second interpolation clock signal PCLK<2> in response to the third division clock signal DCLK<3>, a third inverter IV353 driving the third interpolation clock signal PCLK<3> in response to the fourth division clock signal DCLK<4>, and a fourth inverter IV354 driving the fourth interpolation clock signal PCLK<4> in response to the first division clock signal DCLK<1>.

The third selection driver 36 may receive the first to fourth division clock signals DCLK<1:4> to drive the first to fourth interpolation clock signals PCLK<1:4> using the first driving current ID1 as a power supply current. The third selection driver 36 may receive the first driving current ID1 through the second switch SW32 which is turned on by the first switching control signal SWCNT<1> having a logic "high" level. The third selection driver 36 may include a first inverter IV361 driving the first interpolation clock signal PCLK<1> in response to the third division clock signal DCLK<3>, a second inverter IV362 driving the second interpolation clock signal PCLK<2> in response to the fourth division clock signal DCLK<4>, a third inverter IV363 driving the third interpolation clock signal PCLK<3> in response to the first division clock signal DCLK<1>, and a fourth inverter IV364 driving the fourth interpolation clock signal PCLK<4> in response to the second division clock signal DCLK<2>.

The fourth selection driver 37 may receive the first to fourth division clock signals DCLK<1:4> to drive the first to fourth interpolation clock signals PCLK<1:4> using the second driving current ID2 as a power supply current. The fourth selection driver 37 may receive the second driving current ID2 through the fourth switch SW34 which is turned on by the second switching control signal SWCNT<2> having a logic "high" level. The fourth selection driver 37 may include a first inverter IV371 driving the first interpolation clock signal PCLK<1> in response to the fourth division clock signal DCLK<4>, a second inverter IV372 driving the second interpolation clock signal PCLK<2> in response to the first division clock signal DCLK<1>, a third inverter IV373 driving the third interpolation clock signal PCLK<3> in response to the second division clock signal DCLK<2>, and a fourth inverter IV374 driving the fourth interpolation clock signal PCLK<4> in response to the third division clock signal DCLK<3>.

The driving current selection/discharge unit 38 may drain the first and second driving currents ID1 and ID2 from the first to fourth selection drivers 34, 35, 36, and 37 in response to the first and second switching control signals SWCNT<1:2>. The driving current selection/discharge unit 38 may selectively drain the current from the first to fourth selection drivers 34, 35, 36, and 37 according to a logic level combination of the first and second switching control signals SWCNT<1:2>.

The driving current selection/discharge unit 38 may include a fifth switch SW35 and a seventh switch SW37 which are turned on and a sixth switch SW36 and an eighth switch SW38 which are turned off, if the first and second switching control signals SWCNT<1:2> have a logic level combination of 'L,L'. The turned on switches among the fifth to eighth switches SW35, SW36, SW37, and SW38 according to a logic level combination of the first and second switching control signals SWCNT<1:2> may be set to be different according to the embodiment. If the first and second switching control signals SWCNT<1:2> have a logic level combination of 'L,L', the driving current selection/discharge unit 38 may drain a current from the first selection driver 34 through the fifth switch SW35 which is turned on and may drain a current from the second selection driver 35 through the seventh switch SW37 which is turned on.

If the first and second switching control signals SWCNT<1:2> have a logic level combination of 'L,H', the fifth and eighth switches SW35 and SW38 of the driving current selection/discharge unit 38 may be turned on and the sixth and seventh switches SW36 and SW37 of the driving current selection/discharge unit 38 may be turned off. If the first and second switching control signals SWCNT<1:2> have a logic level combination of 'L,H', the driving current selection/discharge unit 38 may drain a current from the first selection driver 34 through the fifth switch SW35 which is turned on and may drain a current from the fourth selection driver 37 through the eighth switch SW38 which is turned on.

If the first and second switching control signals SWCNT<1:2> have a logic level combination of 'H,L', the sixth and seventh switches SW36 and SW37 of the driving current selection/discharge unit 38 may be turned on and the fifth and eighth switches SW35 and SW38 of the driving current selection/discharge unit 38 may be turned off. If the first and second switching control signals SWCNT<1:2> have a logic level combination of 'H,L', the driving current selection/discharge unit 38 may drain a current from the third selection driver 36 through the sixth switch SW36 which is turned on and may drain a current from the second selection driver 35 through the seventh switch SW37 which is turned on.

If the first and second switching control signals SWCNT<1:2> have a logic level combination of 'H,H', the sixth and eighth switches SW36 and SW38 of the driving current selection/discharge unit 38 may be turned on and the fifth and seventh switches SW35 and SW37 of the driving current selection/discharge unit 38 may be turned off. If the first and second switching control signals SWCNT<1:2> have a logic level combination of 'H,H', the driving current selection/discharge unit 38 may drain a current from the third selection driver 36 through the sixth switch SW36 which is turned on and may drain a current from the fourth selection driver 37 through the eighth switch SW38 which is turned on.

The first current discharger 391 may drain a current flowing through the fifth switch SW35 or the sixth switch SW36 in response to the first to $L^{th}$ current control signals ICNT<1:L>. The first current discharger 391 may control an amount $\alpha I_{REF}$ of current which is drained through the fifth switch SW35 or the sixth switch SW36 according to a logic level combination of the first to $L^{th}$ current control signals ICNT<1:L>.

The second current discharger 392 may drain a current flowing through the seventh switch SW37 or the eighth switch SW38 in response to the first to $L^{th}$ current control signals ICNT<1:L>. The second current discharger 392 may control an amount $(1-\alpha)I_{REF}$ of current which is drained through the seventh switch SW37 or the eighth switch SW38 according to a logic level combination of the first to $L^{th}$ current control signals ICNT<1:L>.

An operation of the interpolation clock generation circuit 3 will be described more fully hereinafter with reference to FIGS. 4, 5 and 6 under the assumption that the number "L" of bits included in the first to $L^{th}$ current control signals ICNT<1:L> is two.

Figure 4:
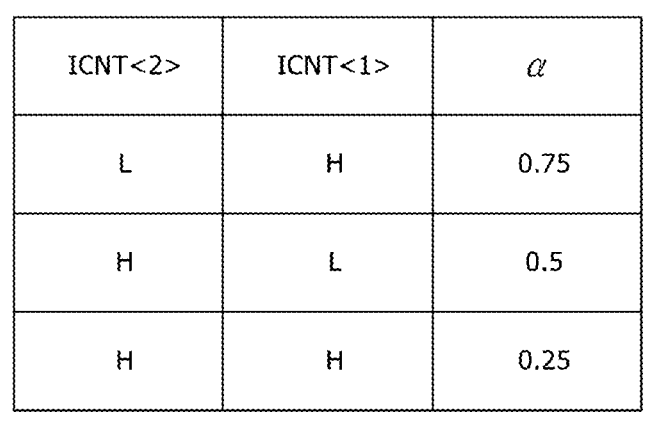

Referring to FIG. 4, an amount $\alpha I_{REF}$ of the first driving current ID1 and an amount $(1-\alpha)I_{REF}$ of the second driving current ID2 may be calculated according to a logic level combination of the first and second current control signals ICNT<1:2>. If the first and second current control signals ICNT<1:2> have a logic level combination of 'H,L', a value of "a" may be set to be 0.75. Thus, the amount $\alpha I_{REF}$ of the first driving current ID1 may be set to be $0.75 \times I_{REF}$, and the amount $(1-\alpha)I_{REF}$ of the second driving current ID2 may be set to be $0.25 \times I_{REF}$. In the first and second current control signals ICNT<1:2>, a logic level combination of 'H,L' means that the first current control signal ICNT<1> has a logic "high" level and the second current control signal ICNT<2> has a logic "low" level. If the first and second current control signals ICNT<1:2> have a logic level combination of 'L,H', a value of "a" may be set to be 0.5. Thus, the amount $\alpha I_{REF}$ of the first driving current ID1 may be set to be $0.5 \times I_{REF}$, and the amount $(1-\alpha)I_{REF}$ of the second driving current ID2 may be set to be $0.5 \times I_{REF}$. In the first and second current control signals ICNT<1:2>, a logic level combination of 'L,H' means that the first current control signal ICNT<1> has a logic "low" level and the second current control signal ICNT<2> has a logic "high" level. If the first and second current control signals ICNT<1:2> have a logic level combination of 'H,H', a value of "a" may be set to be 0.25. Thus, the amount $\alpha I_{REF}$ of the first driving current ID1 may be set to be $0.25 \times I_{REF}$, and the amount $(1-\alpha)I_{REF}$ of the second driving current ID2 may be set to be $0.75 \times I_{REF}$. In the first and second current control signals ICNT<1:2>, a logic level combination of 'H,H' means that the first current control signal ICNT<1> has a logic "high" level and the second current control signal ICNT<2> has a logic "high" level.

The interpolation clock generation circuit 3 may select two drivers of the first to fourth selection drivers 34, 35, 36 and 37 as a first selected selection driver and a second selected selection driver according to a logic level combination of at least one of the first and second switching control signals SWCNT<1:2> and may drive the interpolation clock signal using the first and second selected selection drivers with a drivability which is set by a logic level combination of the first and second current control signals ICNT<1:2>. The interpolation clock signal driven by the above manner may exhibit an improved linearity and a reduced jitter.

Figure 5:
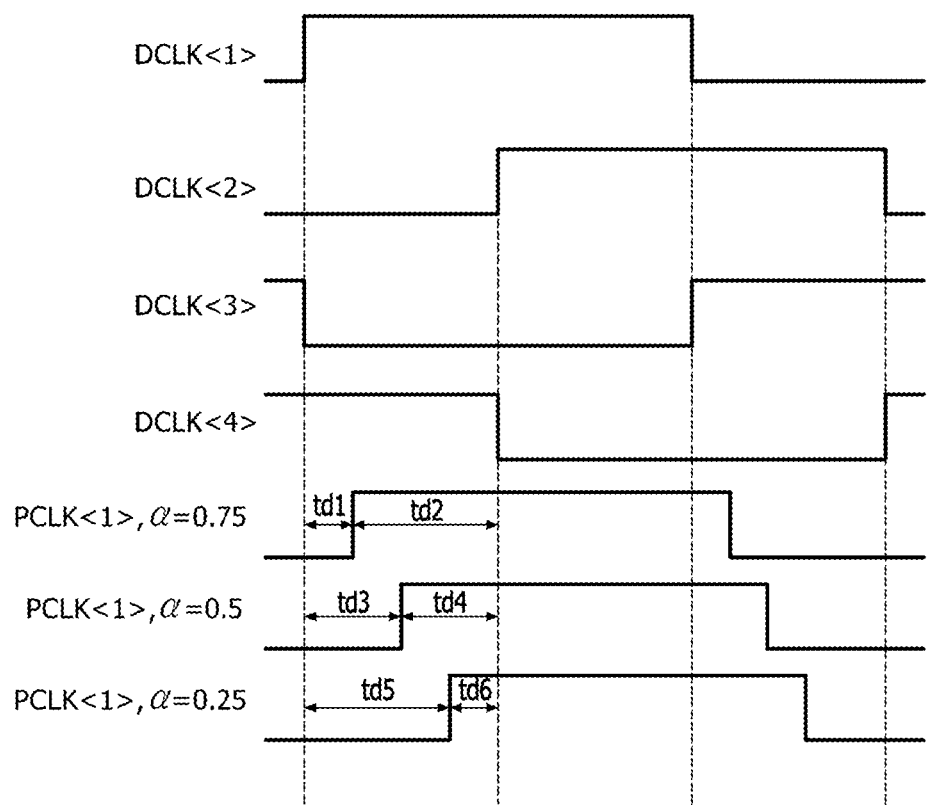
FIGS. 5 and 6 are timing diagrams illustrating operations of the interpolation clock generation circuit shown in FIG. 3.

Referring to FIG. 5, if both of the first and second switching control signals SWCNT<1:2> have a logic "low" level, the first selection driver 34 may receive the first division clock signal DCLK<1> to drive with a first drivability the first interpolation clock signal PCLK<1> using the first driving current ID1 as a power supply current and the second selection driver 35 may receive the second division clock signal DCLK<2> to drive with a second drivability the first interpolation clock signal PCLK<1> using the second driving current ID2 as a power supply current. In such a case, a phase of the first interpolation clock signal PCLK<1> may be controlled according to an amount of the first driving current ID1 and an amount of the second driving current ID2. If the first and second current control signals ICNT<1:2> have a logic level combination of 'H,L', the value of "a" may be set to be 0.75 as described with reference to FIG. 4. Thus, the amount of the first driving current ID1 may be set to be $0.75 \times I_{REF}$, and the amount of the second driving current ID2 may be set to be $0.25 \times I_{REF}$. That is, when the value of "α" is set to be 0.75, the first selection driver 34 may drive with a first drivability the first interpolation clock signal PCLK<1> with the first driving current ID1 which is three times larger than the second driving current ID2 supplied to the second selection driver 35. Accordingly, while the first division clock signal DCLK<1> has a logic "high" level and the second division clock signal DCLK<2> has a logic "low" level, the first interpolation clock signal PCLK<1> outputted from the first inverter IV341 of the first selection driver 34 and the first inverter IV351 of the second selection driver 35 may be generated to have a logic "low" level during a time period "td1" and to have a logic "high" level during a time period "td2" which is three times the time period "td1". If the first and second current control signals ICNT<1:2> have a logic level combination of 'L,H', the value of "α" may be set to be 0.5 as described with reference to FIG. 4. Thus, the amount of the first driving current ID1 may be set to be $0.5 \times I_{REF}$, and the amount of the second driving current ID2 may also be set to be $0.5 \times I_{REF}$. That is, when the value of "α" is set to be 0.5, the first and second selection drivers 34 and 35 may drive the first interpolation clock signal PCLK<1> with the same driving current corresponding to the first driving current ID1 or the second driving current ID2. Accordingly, while the first division clock signal DCLK<1> has a logic "high" level and the second division clock signal DCLK<2> has a logic "low" level, the first interpolation clock signal PCLK<1> outputted from the first inverter IV341 of the first selection driver 34 and the first inverter IV351 of the second selection driver 35 may be generated to have a logic "low" level during a time period "td3" and to have a logic "high" level during a time period "td4" having the same width as the time period "td3". If the first and second current control signals ICNT<1:2> have a logic level combination of 'H,H', the value of "α" may be set to be 0.25 as described with reference to FIG. 4. Thus, the amount of the first driving current ID1 may be set to be $0.25 \times I_{REF}$, and the amount of the second driving current ID2 may be set to be $0.75 \times I_{REF}$. That is, when the value of "α" is set to be 0.25, the second selection driver 35 may drive with a second drivability the first interpolation clock signal PCLK<1> with the second driving current ID2 which is three times larger than the first driving current ID1 supplied to the first selection driver 34. Accordingly, while the first division clock signal DCLK<1> has a logic "high" level and the second division clock signal DCLK<2> has a logic "low" level, the first interpolation clock signal PCLK<1> outputted from the first inverter IV341 of the first selection driver 34 and the first inverter IV351 of the second selection driver 35 may be generated to have a logic "low" level during a time period "td5" and to have a logic "high" level during a time period "td6" which is one third the time period "td5".

Figure 6:
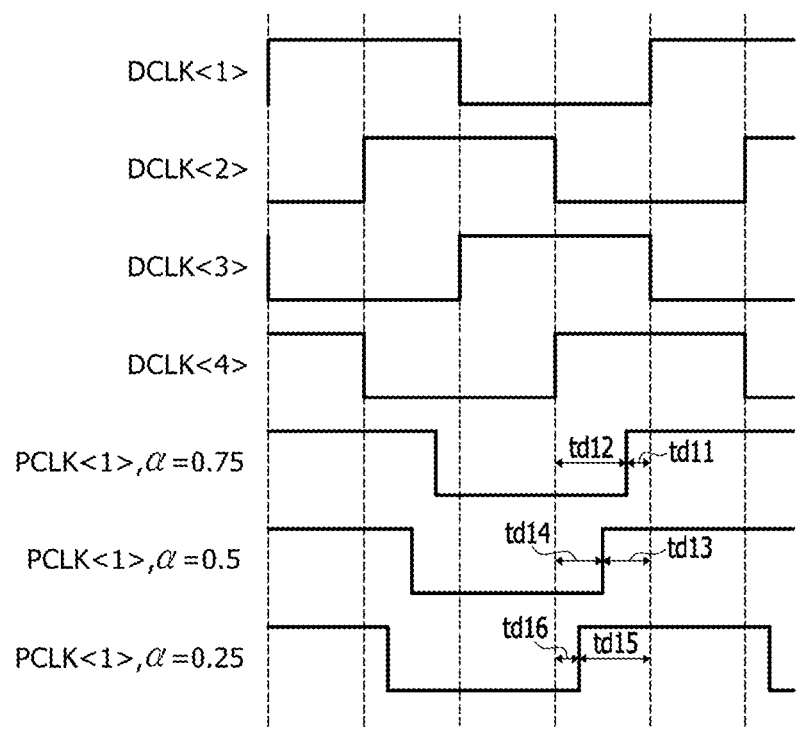

Referring to FIG. 6, if the first switching control signal SWCNT<1> has a logic "low" level and the second switching control signals SWCNT<2> have a logic "high" level, the first selection driver 34 may receive the first division clock signal DCLK<1> to drive the first interpolation clock signal PCLK<1> using the first driving current ID1 as a power supply current and the fourth selection driver 37 may receive the fourth division clock signal DCLK<4> to drive the first interpolation clock signal PCLK<1> using the second driving current ID2 as a power supply current. In such a case, a phase of the first interpolation clock signal PCLK<1> may be controlled according to an amount of the first driving current ID1 and an amount of the second driving current ID2. If the first and second current control signals ICNT<1:2> have a logic level combination of 'H,L', the value of "a" may be set to be 0.75 as described with reference to FIG. 4. Thus, the amount of the first driving current ID1 may be set to be $0.75 \times I_{REF}$, and the amount of the second driving current ID2 may be set to be $0.25 \times I_{REF}$. That is, when the value of "a" is set to be 0.75, the first selection driver 34 may drive the first interpolation clock signal PCLK<1> with the first driving current ID1 which is three times larger than the second driving current ID2 supplied to the fourth selection driver 37. Accordingly, while the first division clock signal DCLK<1> has a logic "low" level and the fourth division clock signal DCLK<4> has a logic "high" level, the first interpolation clock signal PCLK<1> outputted from the first inverter IV341 of the first selection driver 34 and the first inverter IV371 of the fourth selection driver 37 may be generated to have a logic "low" level during a time period "td12" and to have a logic "high" level during a time period "td11" which is one third the time period "td12". If the first and second current control signals ICNT<1:2> have a logic level combination of 'L,H', the value of "α" may be set to be 0.5 as described with reference to FIG. 4. Thus, the amount of the first driving current ID1 may be set to be $0.5 \times I_{REF}$, and the amount of the second driving current ID2 may also be set to be $0.5 \times I_{REF}$. That is, when the value of "α" is set to be 0.5, the first and fourth selection drivers 34 and 37 may drive the first interpolation clock signal PCLK<1> with the same driving current corresponding to the first driving current ID1 or the second driving current ID2. Accordingly, while the first division clock signal DCLK<1> has a logic "low" level and the fourth division clock signal DCLK<4> has a logic "high" level, the first interpolation clock signal PCLK<1> outputted from the first inverter IV341 of the first selection driver 34 and the first inverter IV371 of the fourth selection driver 37 may be generated to have a logic "low" level during a time period "td14" and to have a logic "high" level during a time period "td13" having the same width as the time period "td14". If the first and second current control signals ICNT<1:2> have a logic level combination of 'H,H', the value of "a" may be set to be 0.25 as described with reference to FIG. 4. Thus, the amount of the first driving current ID1 may be set to be $0.25 \times I_{REF}$, and the amount of the second driving current ID2 may be set to be $0.75 \times I_{REF}$. That is, when the value of "a" is set to be 0.25, the fourth selection driver 37 may drive the first interpolation clock signal PCLK<1> with the second driving current ID2 which is three times larger than the first driving current ID1 supplied to the first selection driver 34. Accordingly, while the first division clock signal DCLK<1> has a logic "low" level and the fourth division clock signal DCLK<4> has a logic "high" level, the first interpolation clock signal PCLK<1> outputted from the first inverter IV341 of the first selection driver 34 and the first inverter IV371 of the fourth selection driver 37 may be generated to have a logic "low" level during a time period "td16" and to have a logic "high" level during a time period "td15" which is three times the time period "td16".

Figure 7:
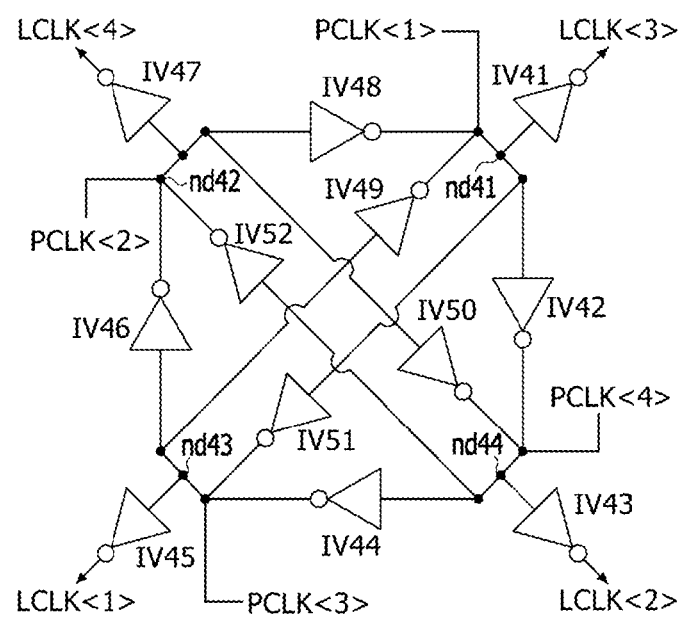
FIG. 7 is a circuit diagram illustrating an example of a locked clock generation circuit included in the internal clock generation circuit of FIG. 1.

Referring to FIG. 7, the locked clock generation circuit 4 may include a plurality of inverters IV41~IV52. The inverter IV41 may inversely buffer the first interpolation clock signal PCLK<1> inputted through a node nd41 to generate the third locked clock signal LCLK<3>. The inverter IV42 may be coupled between the node nd41 and a node nd44. The inverter IV43 may inversely buffer the fourth interpolation clock signal PCLK<4> inputted through the node nd44 to generate the second locked clock signal LCLK<2>. The inverter IV44 may be coupled between a node nd43 and the node nd44. The inverter IV45 may inversely buffer the third interpolation clock signal PCLK<3> inputted through the node nd43 to generate the first locked clock signal LCLK<1>. The inverter IV46 may be coupled between a node nd42 and the node nd43. The inverter IV47 may inversely buffer the second interpolation clock signal PCLK<2> inputted through the node nd42 to generate the fourth locked clock signal LCLK<4>. The inverter IV48 may be coupled between the node nd41 and the node nd42. The inverter IV49 may be coupled between the node nd41 and the node nd43. The inverter IV50 may be coupled between the node nd42 and the node nd44. The inverter IV51 may be coupled between the node nd41 and the node nd43. The inverter IV52 may be coupled between the node nd44 and the node nd42.

The locked clock generation circuit 4 may be realized using an oscillator 41 that generates the first to fourth locked clock signals LCLK<1:4> corresponding to periodic signals using the inverters IV41~IV52. A cycle time and phases of the first to fourth locked clock signals LCLK<1:4> may vary according to a voltage level of a power supply voltage applied to the inverters IV41~IV52. The first to fourth locked clock signals LCLK<1:4> may be generated by buffering the first to fourth interpolation clock signals PCLK<1:4>. Accordingly, a skew of the first to fourth locked clock signals LCLK<1:4> may be reduced as compared with the first to fourth interpolation clock signals PCLK<1:4>.

Figure 8:
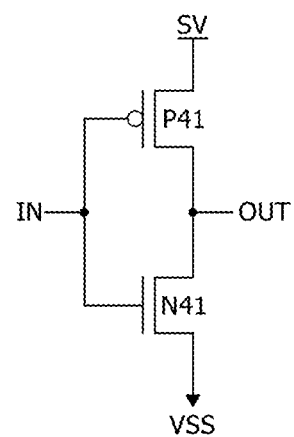
FIG. 8 is a circuit diagram illustrating an example of any inverter included in the locked clock generation circuit of FIG. 7.

Referring to FIG. 8, one of the inverters IV41~IV52 included in the locked clock generation circuit 4 is illustrated. Each of the inverters IV41~IV52 may include a PMOS transistor P41 and an NMOS transistor N41 which are coupled in series between a source voltage SV terminal and a ground voltage VSS terminal. The PMOS transistor P41 may pull up an output signal OUT to the source voltage SV in response to an input signal IN. The NMOS transistor N41 may pull down the output signal OUT to the ground voltage VSS in response to the input signal IN. Each of the inverters IV41~IV52 may function as a buffer driven by the source voltage SV that buffers the input signal IN to output the buffered signal as the output signal OUT using the source voltage SV as a power supply voltage. A drivability of each of the inverters IV41~IV52 may be controlled according to a voltage level of the source voltage SV. A delay time of each of the inverters IV41~IV52 may have the same delay time as the predetermined delay time, but delay time of each of the inverters IV41~IV52 may increase if a voltage level of the source voltage SV is lowered.

Figure 9:
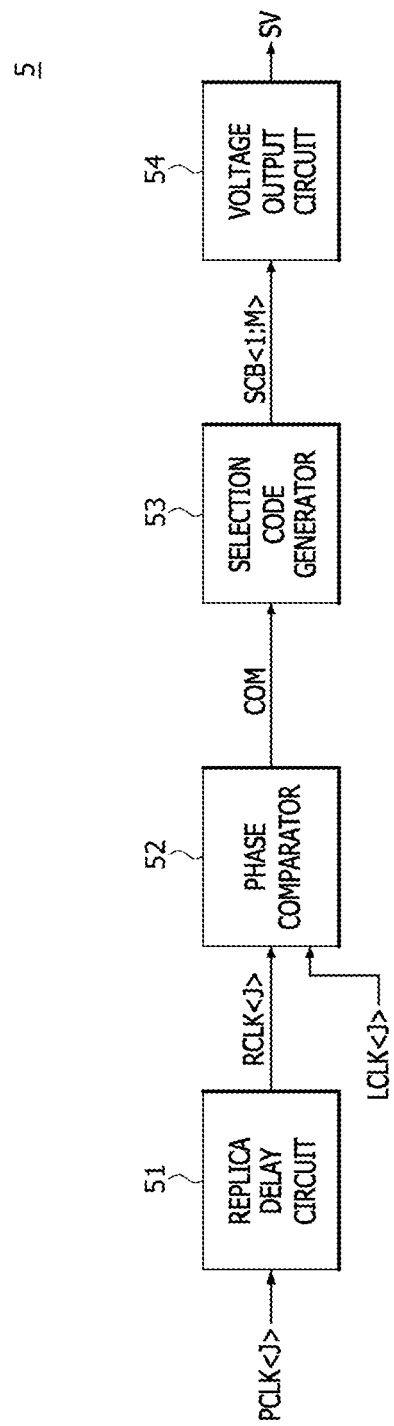
FIG. 9 is a block diagram illustrating an example of a source voltage generation circuit included in the internal clock generation circuit of FIG. 1.

Referring to FIG. 9, the source voltage generation circuit 5 may include a replica delay circuit 51, a phase comparator 52, a selection code generator 53, and a voltage output circuit 54.

The replica delay circuit 51 may generate a $J^{th}$ replica clock signal RCLK<J> in response to a $J^{th}$ interpolation clock signals PCLK<J> corresponding to any one of the first to fourth interpolation clock signals PCLK<1:4>. The replica delay circuit 51 may delay the $J^{th}$ interpolation clock signals PCLK<J> for a predetermined replica delay time to generate the $J^{th}$ replica clock signal RCLK<J>. A delay time of the replica delay circuit 51 may be set to be a cycle time of the periodic signals generated by the oscillator of the locked clock generation circuit 4. A delay time of the replica delay circuit 51 may be set to be different according to the embodiment.

The phase comparator 52 may detect a phase difference between the $J^{th}$ replica clock signal RCLK<J> and the $J^{th}$ locked clock signal LCLK<J> to generate a comparison signal COM. The phase comparator 52 may compare a phase of the $J^{th}$ replica clock signal RCLK<J> with a phase of the $J^{th}$ locked clock signal LCLK<J> to generate the comparison signal COM. The phase comparator 52 may generate the comparison signal COM having a first logic level if a phase of the $J^{th}$ replica clock signal RCLK<J> precedes a phase of the $J^{th}$ locked clock signal LCLK<J>. The phase comparator 52 may generate the comparison signal COM having a second logic level if a phase of the $J^{th}$ locked clock signal LCLK<J> precedes a phase of the $J^{th}$ replica clock signal RCLK<J>.

The selection code generator 53 may generate first to $M^{th}$ selection codes SCB<1:M> in response to the comparison signal COM. The selection code generator 53 may generate the first to $M^{th}$ selection codes SCB<1:M>, a logic level combination of which varies to increase a delay time of the replica delay circuit 51 if the comparison signal COM has the first logic level. The selection code generator 53 may generate the first to $M^{th}$ selection codes SCB<1:M>, a logic level combination of which varies to reduce a delay time of the replica delay circuit 51, if the comparison signal COM has the second logic level. The selection code generator 53 may output the first to $M^{th}$ selection codes SCB<1:M> that are counted according to a logic level of the comparison signal COM.

The voltage output circuit 54 may drive the source voltage SV in response to the first to $M^{th}$ selection codes SCB<1:M>. The voltage output circuit 54 may drive the source voltage SV according to a logic level combination of the first to $M^{th}$ selection codes SCB<1:M>.

The source voltage generation circuit 5 may control a voltage level of the source voltage SV by varying a logic level combination of the first to $M^{th}$ selection codes SCB<1:M> until the first to fourth replica clock signals RCLK<1:4> are synchronized with the first to fourth locked clock signals LCLK<1:4>, that is, the first to fourth replica clock signals RCLK<1:4> are locked by the first to fourth locked clock signals LCLK<1:4>. The locked clock generation circuit 4 may control a drivability of the inverters IV41~IV52 according to a voltage level of the source voltage SV so that a difference between a cycle time of the first to fourth interpolation clock signals PCLK<1:4> and a cycle time of periodic signals generated by the oscillator included in the locked clock generation circuit 4 is equal to or less than a predetermined value.

Figure 10:
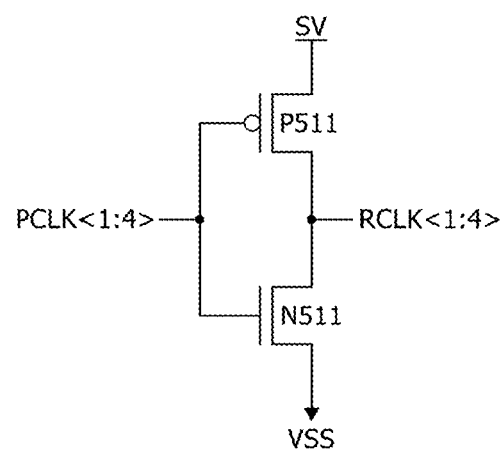
FIG. 10 is a circuit diagram illustrating an example of a replica delay circuit included in the source voltage generation circuit of FIG. 9.

Referring to FIG. 10, the replica delay circuit 51 may include a PMOS transistor P511 and an NMOS transistor N511 which are coupled in series between the source voltage SV terminal and the ground voltage VSS terminal. The PMOS transistor P511 may pull up the first to fourth replica clock signals RCLK<1:4> to the source voltage SV in response to the first to fourth interpolation clock signals PCLK<1:4>. The NMOS transistor N511 may pull down the first to fourth replica clock signals RCLK<1:4> to the ground voltage VSS in response to the first to fourth interpolation clock signals PCLK<1:4>. The replica delay circuit 51 may be designed to have the same delay time as the inverters IV41~IV52 included in the locked clock generation circuit 4.

Figure 11:
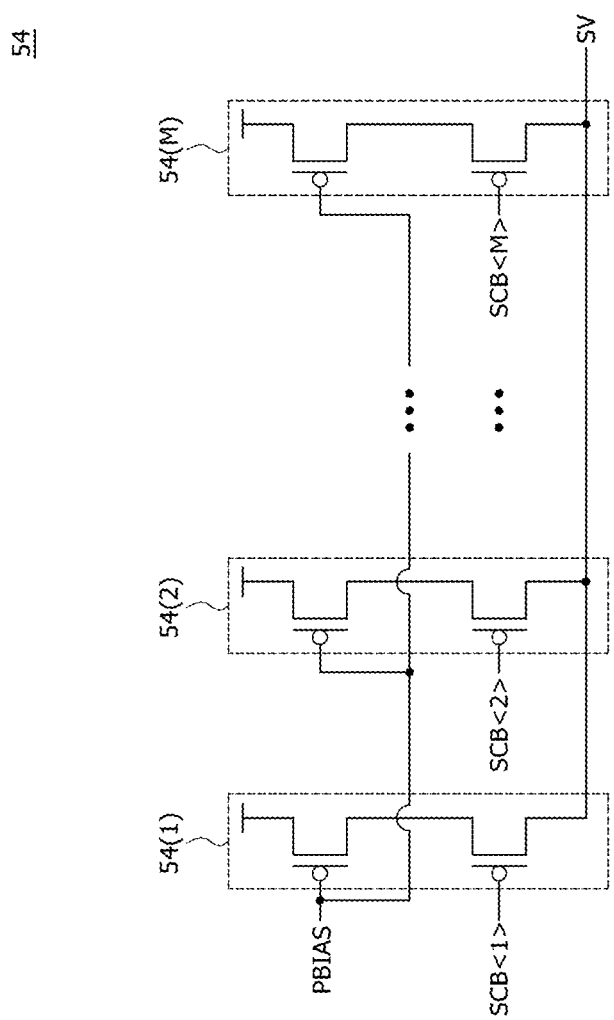
FIG. 11 is a circuit diagram illustrating an example of a voltage output circuit included in the source voltage generation circuit of FIG. 9.

Referring to FIG. 11, the voltage output circuit 54 may include first to $M^{th}$ drivers 54(1)~54(M) which are coupled in parallel between a power supply voltage terminal and the source voltage SV terminal. Each of the first to $M^{th}$ drivers 54(1)~54(M) may be configured to include two PMOS transistors which are coupled in series between the power supply voltage terminal and the source voltage SV terminal. The first driver 54(1) may pull up the source voltage SV to the power supply voltage in response to a bias voltage PBIAS and the first selection code SCB<1>. The bias voltage PBIAS may be set to have a voltage level at which the PMOS transistors of the voltage output circuit 54 can operate in a saturation region. The first driver 54(1) may pull up the source voltage SV if the first selection code SCB<1> has a logic "low" level. The second driver 54(2) may pull up the source voltage SV to the power supply voltage in response to the bias voltage PBIAS and the second selection code SCB<2>. The second driver 54(2) may pull up the source voltage SV if the second selection code SCB<2> has a logic "low" level. The $M^{th}$ driver 54(M) may pull up the source voltage SV to the power supply voltage in response to the bias voltage PBIAS and the $M^{th}$ selection code SCB<M>. The $M^{th}$ driver 54(M) may pull up the source voltage SV if the $M^{th}$ selection code SCB<M> has a logic "low" level.

Figure 12:
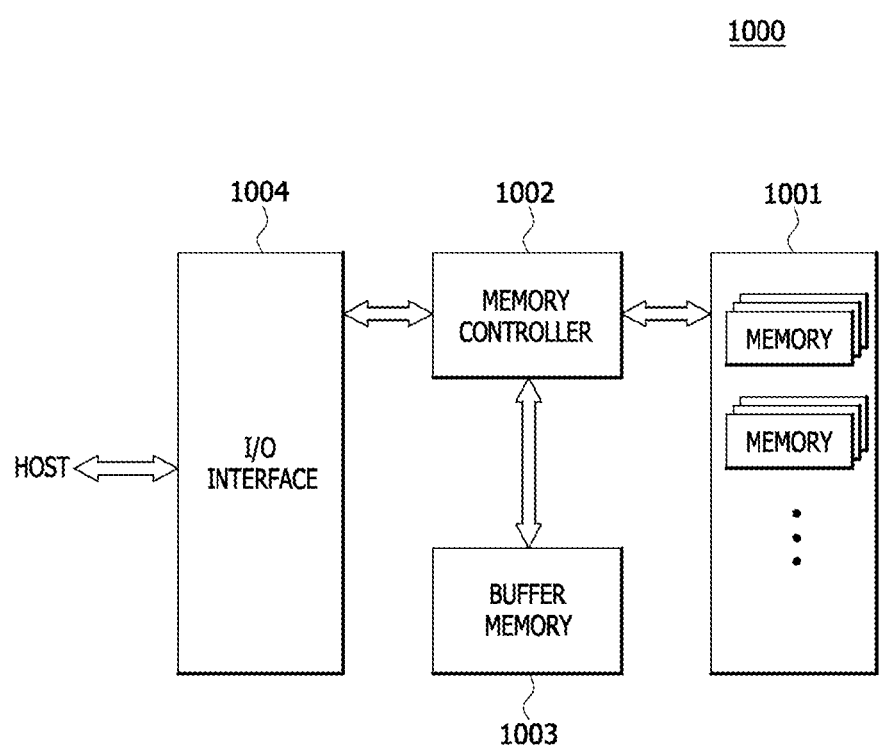
FIG. 12 is a block diagram illustrating a configuration of an electronic system employing the internal clock generation circuit shown in FIG. 1.

The internal voltage generation circuit described with reference to FIGS. 1 to 11 may be applied to an electronic system that includes a memory system, a graphic system, a computing system, a mobile system, or the like. For example, as illustrated in FIG. 12, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated by the memory controller 1002. Meanwhile, the data storage circuit 1001 may include a nonvolatile memory that can retain its stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003, or for outputting the data stored in the data storage circuit 1001 or the buffer memory 1003. Although FIG. 12 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data to be processed by the memory controller 1002. That is, the buffer memory 1003 may temporarily store the data which is outputted from or to be inputted to the data storage circuit 1001. The buffer memory 1003 may store the data, which is outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. An internal clock generation circuit comprising:
an interpolation clock generation circuit configured to generate an interpolation clock signal from a division clock signal in response to a switching control signal and a current control signal;
a locked clock generation circuit configured to include an oscillator and configured to generate a locked clock signal for generating an internal clock signal from the interpolation clock signal; and
a source voltage generation circuit configured to generate a source voltage supplied to the locked clock generation circuit in response to the interpolation clock signal and the locked clock signal,
wherein a logic level combination of the switching control signal and a logic level combination of the current control signal are set by comparing a phase of the division clock signal with a phase of a feedback clock signal, and
wherein the feedback clock signal is generated by delaying the locked clock signal for a predetermined delay time.

2. The internal clock generation circuit of claim 1, wherein the predetermined delay time is set to compensate for a delay factor in relation to an external clock signal.

3. The internal clock generation circuit of claim 1,
wherein the division clock signal includes first to fourth division clock signals;
wherein the interpolation clock generation circuit includes first to fourth selection drivers; and
wherein the interpolation clock generation circuit selects two drivers among the first to fourth selection drivers as a first selected selection driver and a second selected selection driver in response to the switching control signal.

4. The internal clock generation circuit of claim 3, wherein the interpolation clock generation circuit is configured to drive the interpolation clock signal using the first selected selection driver with a first drivability and configured to drive the interpolation clock signal using the second selected selection driver with a second drivability.

5. The internal clock generation circuit of claim 4, wherein the interpolation clock generation circuit controls the first drivability and the second drivability in response to the current control signal.

6. The internal clock generation circuit of claim 1,
wherein the division clock signal includes first to fourth division clock signals;
wherein the interpolation clock signal includes first to fourth interpolation clock signals; and
wherein the interpolation clock generation circuit includes:
a first driving current generator configured to generate a first driving current in response to the current control signal; and
a second driving current generator configured to generate a second driving current in response to the current control signal.

7. The internal clock generation circuit of claim 6, wherein the interpolation clock generation circuit further includes a driving current selection/supply unit configured to supply the first driving current to a first selection driver or a second selection driver in response to the switching control signal and configured to supply the second driving current to a third selection driver or a fourth selection driver in response to the switching control signal.

8. The internal clock generation circuit of claim 7, wherein the first selection driver is configured to drive the first interpolation clock signal in response to the first division clock signal, configured to drive the second interpolation clock signal in response to the second division clock signal, configured to drive the third interpolation clock signal in response to the third division clock signal, and configured to drive the fourth interpolation clock signal in response to the fourth division clock signal.

9. The internal clock generation circuit of claim 7, wherein the second selection driver is configured to drive the first interpolation clock signal in response to the third division clock signal, configured to drive the second interpolation clock signal in response to the fourth division clock signal, configured to drive the third interpolation clock signal in response to the first division clock signal, and configured to drive the fourth interpolation clock signal in response to the second division clock signal.

10. The internal clock generation circuit of claim 6, wherein the interpolation clock generation circuit further includes a driving current selection/discharge unit configured to drain the first driving current from a first selection driver or a second selection driver in response to the switching control signal and configured to drain the second driving current from a third selection driver or a fourth selection driver in response to the switching control signal.

11. The internal clock generation circuit of claim 1,
wherein the locked clock generation circuit includes a plurality of buffers driven by a source voltage; and
wherein each of the plurality of buffers is designed to have the same delay time as the predetermined delay time.

12. The internal clock generation circuit of claim 11, wherein each of the plurality of buffers includes:
a pull-up element configured to pull up an output signal to the source voltage in response to an input signal; and
a pull-down element configured to pull down the output signal to a ground voltage in response to the input signal.

13. The internal clock generation circuit of claim 1,
wherein the interpolation clock signal includes first to fourth interpolation clock signals;
wherein the locked clock signal includes first to fourth locked clock signals; and
wherein the locked clock generation circuit includes:
a first buffer configured to buffer the first interpolation clock signal to generate the third locked clock signal;
a second buffer configured to buffer the second interpolation clock signal to generate the fourth locked clock signal;
a third buffer configured to buffer the third interpolation clock signal to generate the first locked clock signal; and
a fourth buffer configured to buffer the fourth interpolation clock signal to generate the second locked clock signal.

14. The internal clock generation circuit of claim 1, wherein the source voltage generation circuit includes a replica delay circuit configured to delay the interpolation clock signal for a predetermined replica delay time to generate a replica clock signal.

15. The internal clock generation circuit of claim 14, wherein the predetermined replica delay time is set to be equal to a cycle time of a periodic signal generated by the oscillator.

16. The internal clock generation circuit of claim 14, wherein the source voltage generation circuit further includes a voltage output circuit configured to output the source voltage, a voltage level of which is determined in response to a selection code whose logic level combination is set by comparing a phase of the replica clock signal and a phase of the locked clock signal.

17. An internal clock generation circuit comprising:
an interpolation clock generation circuit configured to include first to fourth selection drivers, configured to select two drivers among the first to fourth selection drivers as a first selected selection driver and a second selected selection driver in response to a switching control signal, configured to receive a division clock signal to drive an interpolation clock signal using the first selected selection driver with a first drivability, and configured to receive the division clock signal to drive the interpolation clock signal using the second selected selection driver with a second drivability; and
a locked clock generation circuit configured to include an oscillator and configured to generate a locked clock signal for generating an internal clock signal from the interpolation clock signal; and
a source voltage generation circuit configured to generate a source voltage supplied to the locked clock generation circuit in response to the interpolation clock signal and the locked clock signal.

18. The internal clock generation circuit of claim 17, wherein the interpolation clock generation circuit controls the first drivability and the second drivability in response to a current control signal.

19. The internal clock generation circuit of claim 18, wherein the interpolation clock generation circuit includes:
a first driving current generator configured to generate a first driving current in response to the current control signal; and
a second driving current generator configured to generate a second driving current in response to the current control signal.

20. The internal clock generation circuit of claim 19, wherein the interpolation clock generation circuit further includes a driving current selection/supply unit configured to supply the first driving current to a first selection driver or a second selection driver in response to the switching control signal and configured to supply the second driving current to a third selection driver or a fourth selection driver in response to the switching control signal.

21. The internal clock generation circuit of claim 20,
wherein the division clock signal includes first to fourth division clock signals;
wherein the interpolation clock signal includes first to fourth interpolation clock signals; and
wherein the first selection driver is configured to drive the first interpolation clock signal in response to the first division clock signal, configured to drive the second interpolation clock signal in response to the second division clock signal, configured to drive the third interpolation clock signal in response to the third division clock signal, and configured to drive the fourth interpolation clock signal in response to the fourth division clock signal.

22. The internal clock generation circuit of claim 20,
wherein the division clock signal includes first to fourth division clock signals;
wherein the interpolation clock signal includes first to fourth interpolation clock signals; and
wherein the second selection driver is configured to drive the first interpolation clock signal in response to the third division clock signal, configured to drive the second interpolation clock signal in response to the fourth division clock signal, configured to drive the third interpolation clock signal in response to the first division clock signal, and configured to drive the fourth interpolation clock signal in response to the second division clock signal.

23. The internal clock generation circuit of claim 19, wherein the interpolation clock generation circuit further includes a driving current selection/discharge unit configured to drain the first driving current from a first selection driver or a second selection driver in response to the switching control signal and configured to drain the second driving current from a third selection driver or a fourth selection driver in response to the switching control signal.

24. The internal clock generation circuit of claim 18,
wherein a logic level combination of the switching control signal and a logic level combination of the current control signal are set by comparing a phase of the division clock signal with a phase of a feedback clock signal; and
wherein the feedback clock signal is generated by delaying the locked clock signal for a predetermined delay time.

25. The internal clock generation circuit of claim 24,
wherein the locked clock generation circuit includes a plurality of buffers driven by a source voltage; and
wherein each of the plurality of buffers is designed to have the same delay time as the predetermined delay time.

26. The internal clock generation circuit of claim 25, wherein each of the plurality of buffers includes:
a pull-up element configured to pull up an output signal to the source voltage in response to an input signal; and
a pull-down element configured to pull down the output signal to a ground voltage in response to the input signal.

27. The internal clock generation circuit of claim 17,
wherein the interpolation clock signal includes first to fourth interpolation clock signals;
wherein the locked clock signal includes first to fourth locked clock signals; and
wherein the locked clock generation circuit includes:
a first buffer configured to buffer the first interpolation clock signal to generate the third locked clock signal;
a second buffer configured to buffer the second interpolation clock signal to generate the fourth locked clock signal;
a third buffer configured to buffer the third interpolation clock signal to generate the first locked clock signal; and
a fourth buffer configured to buffer the fourth interpolation clock signal to generate the second locked clock signal.

28. The internal clock generation circuit of claim 17, wherein the source voltage generation circuit includes a replica delay circuit configured to delay the interpolation clock signal for a predetermined replica delay time to generate a replica clock signal.

29. The internal clock generation circuit of claim 28, wherein the predetermined replica delay time is set to be equal to a cycle time of a periodic signal generated by the oscillator.

30. The internal clock generation circuit of claim 28, wherein the source voltage generation circuit further includes a voltage output circuit configured to output the source voltage, a voltage level of which is determined in response to a selection code whose logic level combination is set by comparing a phase of the replica clock signal and a phase of the locked clock signal.

* * * * *